United States Patent
Decker et al.

(10) Patent No.: US 10,615,206 B2
(45) Date of Patent: Apr. 7, 2020

(54) IMAGE-SENSOR MODULE

(71) Applicant: Robert Bosch GmbH, Stuttgart (DE)

(72) Inventors: Christoph Decker, Leonberg (DE);
Johannes Eschler, Weil der Stadt (DE);
Martin Reiche, Weil der Stadt (DE);
Nikolai Bauer, Moeglingen (DE);
Thomas Braune, Calw (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/013,463

(22) Filed: Jun. 20, 2018

(65) Prior Publication Data
US 2018/0374885 A1 Dec. 27, 2018

(30) Foreign Application Priority Data
Jun. 21, 2017 (DE) .................. 10 2017 210 379

(51) Int. Cl.
*H01L 27/146* (2006.01)
*H04N 5/225* (2006.01)
*G02B 5/20* (2006.01)

(52) U.S. Cl.
CPC ........ *H01L 27/14625* (2013.01); *G02B 5/208* (2013.01); *H01L 27/14618* (2013.01); *H01L 27/14636* (2013.01); *H04N 5/2252* (2013.01); *H04N 5/2253* (2013.01); *H04N 5/2254* (2013.01)

(58) Field of Classification Search
CPC combination set(s) only.
See application file for complete search history.

(56) References Cited

U.S. PATENT DOCUMENTS

| | | | |
|---|---|---|---|
| 9,106,819 B1 * | 8/2015 | Gao | H04N 5/2254 |
| 2003/0128442 A1 | 7/2003 | Tanaka et al. | |
| 2005/0099532 A1 | 5/2005 | Tseng | |
| 2005/0161805 A1 | 7/2005 | Ono et al. | |
| 2006/0171698 A1 * | 8/2006 | Ryu | H01L 27/14618 396/114 |
| 2007/0010041 A1 * | 1/2007 | Kang | H01L 27/14618 438/64 |
| 2007/0241273 A1 * | 10/2007 | Kim | H01L 27/14625 250/239 |
| 2007/0272827 A1 * | 11/2007 | Heo | H01L 27/14618 250/208.1 |
| 2010/0127341 A1 * | 5/2010 | Kawazu | G02B 7/026 257/432 |

FOREIGN PATENT DOCUMENTS

| | | |
|---|---|---|
| DE | 102004001556 A1 | 8/2005 |
| DE | 102013212748 A1 | 12/2014 |
| DE | 102013221704 A1 | 4/2015 |
| KR | 20110001559 A | 1/2011 |

* cited by examiner

*Primary Examiner* — Thao P Le
(74) *Attorney, Agent, or Firm* — Norton Rose Fulbright US LLP; Gerard Messina

(57) ABSTRACT

An image-sensor module includes an image sensor and a protective layer that covers a subregion of an image-sensor surface of the image sensor, where at least two edge regions of the image-sensor surface, for example, edge regions situated at opposite edges of the image sensor, are not covered by the protective layer.

26 Claims, 4 Drawing Sheets

IMAGE-SENSOR MODULE

CROSS-REFERENCE TO RELATED APPLICATIONS

The present application claims priority under 35 U.S.C. § 119 to DE 10 2017 210 379.5, filed in the Federal Republic of Germany on Jun. 21, 2017, the content of which is hereby incorporated by reference herein in its entirety.

FIELD OF THE INVENTION

The present invention relates to an image-sensor module, a camera module, and a method for producing a camera module.

BACKGROUND

Different types of image sensors are known from the related art. For example, there are image sensors that are installed in camera modules without packaging, i.e., without any protective components whatsoever. Known in addition are image sensors that are protected from contamination and mechanical damage with the aid of a glass layer, for example.

SUMMARY

The present invention describes an image module, which includes an image sensor and a protective layer that covers a subregion of an image-sensor surface of the image sensor. At least two edge regions of the image-sensor surface, which are particularly disposed on opposite edges of the image sensor, are not covered by the protective layer.

In this context, edge regions of the image-sensor surface refer to regions on the image sensor that directly abut an edge of the image sensor. For example, if the image sensor has a rectangular shape, then four edges that define edges of the image sensor are usually situated in a plane of the image sensor. Regions that are situated at these edges are referred to as edge regions. For instance, if multiple subregions of the image-sensor surface that are situated at edges of the image sensor are not covered by the protective layer, then the present application refers to multiple edge regions that are not covered by the protective layer. The image sensor preferably includes two edge regions which are not covered by the protective layer and which are disposed on opposite edges of the image sensor. This has an advantage that a securing of the image sensor, e.g., on a lens carrier, is able to be carried out in a stable manner via the two edge regions not covered by the protective layer. Alternatively or additionally, however, it is also conceivable that the at least two edge regions not covered by the protective layer are situated at two edges that are in contact with each other and possibly form a continuous region that is not covered by the protective layer. A stable securing of the image sensor by fastening the image sensor to two directly abutting edge regions is also possible.

The protective layer covering at least subregions of the image sensor has a lateral extension in relation to the image-sensor surface that is smaller than the lateral extension of the image-sensor surface in at least one direction. If the lateral extension is smaller in only one direction, then the image sensor can have two edge regions that lie opposite each other and are not covered by the protective layer. If the lateral extension is smaller than the lateral extension of the image sensor in another direction as well, then it is also possible that two abutting edge regions of the image sensor are not covered by the protective layer.

This example embodiment of the image-sensor module allows for a highly precise installation of the image-sensor module in a camera system. The image-sensor surface not covered by the protective layer virtually lies in the image-sensor plane of the image sensor and usually has no tolerance with respect thereto. A securing of the image-sensor module to the uncovered edge regions thus allows for a highly precise alignment of an image sensor in a camera module.

For instance, if the image-sensor module is installed in a lens holder on which a lens is placed in addition, then an alignment of the lens in only three degrees of freedom is sufficient at very slight tilting of the lens in relation to a mechanical axis of the lens. Additional tilting of the lens would no longer be necessary because of the highly precise installation of the image-sensor module.

In an example embodiment of the image-sensor module, the protective layer is developed as a glass lid. This example embodiment of the present invention offers an advantage that a mechanical protection of the image sensor is able to be ensured while an optimal transmission of light of a defined wavelength can be ensured at the same time. A glass lid, for example, can be understood to refer to a glass disk. As the case may be, it can be developed such that it has special optical properties such as a frequency filter.

In an example embodiment of the present invention, this glass lid is mounted on the image sensor with the aid of an adhesive, in particular with the aid of a transparent adhesive. This example embodiment of the present invention offers an advantage that a transparent adhesive whose optical properties do not adversely affect the functional capability of the image sensor may be used as the fastening material.

In an example embodiment of the present invention, the glass lid is configured as an infrared filter, which particularly filters out infrared light starting at a predefined wavelength or frequency. This example embodiment of the present invention offers an advantage that an undesired heat radiation is able to be kept away from the image sensor so that its temperature does not rise excessively during the operation and thereby possibly restricts the functional capability of the image sensor.

In an example embodiment of the present invention, a transparent casting compound, in particular a transparent adhesive, forms the protective layer. The transparent casting compound, for example, can be a special silicone or a transparent casting compound on a polyurethane or epoxy basis. This example embodiment of the present invention offers an advantage that an individually moldable protective layer is able to be produced. Various dimensions and forms of the protective layer are realizable through the selection of the casting-compound quantity and/or the adhesive and the type of application of the casting compound as a protective layer on the image sensor. In addition, the use of a casting compound allows for very short production times at very low expense.

In a further example embodiment of the present invention, all edge regions of the image-sensor surface situated at edges of the image sensor are not covered by the protective layer.

In this case, the protective layer is developed in such a way that it does not extend to an edge of the image sensor at any point on the image-sensor surface. This example embodiment of the present invention offers an advantage that it allows for a highly accurate mounting of the image-sensor module on a camera system. If the protective layer does not cover all edge regions of the image sensor, then a highly accurate mounting of the image sensor is able to be accomplished via all edges of the image sensor, thereby making it possible to fix the image sensor in place on other structures such as a lens carrier in a very stable and reliable manner.

In a further example embodiment of the present invention, an edge region of the image-sensor surface that is not covered by the protective layer is developed at least along one edge of the image sensor, this edge region having a continuous width that especially corresponds to the smallest distance between the image-sensor surface covered by the protective layer and the edge of the image sensor, the width amounting to at least 100 µm, in particular to at least 300 µm, and furthermore, especially to at least 500 µm.

Due to the extension of the provided edge region not covered by the protective layer, this example embodiment of the present invention offers an advantage of allowing for a reliable securing of the image-sensor module via this edge region. The width of the edge not covered by the protective layer may vary depending on the size of the image sensor used. In the case of larger image sensors, it is by all means possible to use even widths in the mm range, e.g., edges having a width of 1 mm. Depending on the type of image sensor, the width can also amount to up to 20%, in particular 5%, and furthermore especially 1% of the lateral extension or the length and/or width of the image sensor.

In a preferred example embodiment of the present invention, the image-sensor module has a continuous region that is not covered by the protective layer and that includes all edge regions of the image sensor. In this case, the individual edge regions also have widths of at least 100 µm, especially 300 µm, and particularly also 500 µm.

In a further example embodiment of the present invention, a light-sensitive side of the image sensor is electronically contacted with a side of the image sensor that lies opposite the light-sensitive side of the image sensor, using vias and/or peripheral contactings. The side situated opposite the light-sensitive side of the image sensor in particular has a ball grid for the contacting of the image sensor.

This example embodiment of the present invention offers an advantage of allowing for a particularly easy contacting of the image sensor with a circuit board. For example, the circuit board can be soldered to the rear side or to the side on which no protective layer is applied. No additional wiring that might interfere with the mounting of the image-sensor module has to be provided. A ball grid, for instance, is to be understood as a ball-grid arrangement of the contacting points of the image sensor, which thereby allows for a simplified mounting, especially soldering, of the image sensor on or to a circuit board.

According to an example embodiment of the present invention, a camera module includes a lens holder and an image sensor.

A principle of the present invention is that at least a subregion of an image-sensor surface of the image sensor is directly resting against the lens holder.

This camera module offers an advantage of allowing for a highly accurate alignment of the image sensor in relation to the lens holder. The lens holder has a direct mechanical relationship with the image-sensor plane. If the image sensor as such has a highly accurate planar configuration, then tilting components are absent when the image sensor is directly positioned against the lens holder. For example, if the image sensor is soldered to a circuit board and connected to the lens holder via this circuit board, then a planar affixation is not able to be ensured because of the creation of additional tilting components, especially during the soldering operation.

In addition, the direct positioning of the image sensor on the lens holder creates a very compact development so that the camera module is able to be used in very small systems.

In a further example embodiment of the camera module, the image sensor is developed according to the image-sensor module described above. In addition, the lens holder includes a receptacle for the image-sensor module against which at least two edge regions of the image sensor not covered by the protective layer come to rest directly. This example embodiment of the present invention offers an additional advantage that the image sensor is protected from contamination and mechanical damage by the protective layer that is applied thereon.

According to an example embodiment of the present invention, a method for producing a camera module that includes an image sensor and a lens holder includes the steps of positioning the image sensor on the lens holder so that at least a subregion of an image-sensor surface of the image sensor is directly resting against the lens holder, and securing the image sensor in place on the lens holder.

The securing of the image sensor on the lens holder can be accomplished with the aid of a soldering process, by a welding seam, or via an adhesive joint. The image sensor can be pressed against the lens holder by a corresponding mechanical device and fixed in place in this manner.

The positioning of the image sensor directly against the lens holder at least via a subregion of its image-sensor surface means that no further elements are installed between the image-sensor surface and the lens holder but a direct contact is established. In particular, there are also no adhesives or other materials situated between the image sensor and the lens holder, which could also lead to tilting of the image sensor in relation to the lens holder.

In a further example embodiment of the present method, the image sensor is the afore-described image-sensor module. In the positioning step, the image-sensor module is positioned on the lens holder in such a way that at least two edge regions of the image sensor not covered by the protective layer are resting directly against the lens holder.

In a further example embodiment of the present method, the method includes the additional step of using an adhesive joint between an inner side of the lens holder and the protective layer covering the at least one subregion of an image-sensor surface of the image sensor.

This example embodiment of the present invention offers an advantage of allowing for a reliable mounting/securing of the image-sensor module on the lens holder. The adhesive joint, for instance, can be placed at individual points on the protective layer or it can be implemented in the form of an adhesive bead so that, for example, the protective layer is completely bonded along one of its edges to an inner side of the lens holder.

In a further example embodiment of the present method, the method includes the additional step of mounting, especially soldering, a circuit board on or to the image sensor. This step can be carried out either prior to or following the positioning of the image sensor on the lens holder. It is furthermore possible that the image sensor is fixed in place on the lens holder via the circuit board. Toward this end, the circuit board can be screwed, bonded, soldered or welded to the lens holder, for example.

It is also possible that a process sequence is provided, in which the image sensor is soldered to the circuit board to begin with. The lens holder is then placed on an edge region of the image sensor, either directly or using a positive engagement, and a single bonding process takes place between a base/wall of the lens holder and the circuit board.

In a further example embodiment of the present method, the method includes the additional step of actively aligning a lens in relation to the image sensor, the lens in particular being fixed in place in a position that is optimized in relation to the image sensor.

A position that is optimized relative to the image sensor describes a position in which the image sensor is situated in a preferred image plane of the lens. The preferred image plane is to be understood as an image plane in which an image sensor should be positioned in order to produce the best image possible. For instance, the positioning of the lens can be carried out using known methods such as the "active alignment," for instance. The lens, for example, can be a lens having one or more lens(es) and/or further optical elements typical of a lens.

If the region of the sharp imaging of the lens is only slightly tilted in relation to its mechanical axis, i.e., the lens thus exhibits small tolerances, then an alignment of the lens in three degrees of freedom ($\Delta x$, $\Delta y$, $\Delta z$) without compensation for the tilting is sufficient. The mechanical axis of the lens is defined via an outer contour of the lens holder on which the lens is aligned. If a sufficiently large pixel reserve exists on the image sensor, i.e., a light-sensitive region that is greater than the region illuminated by the incident radiation in the case of an image sensor, then it is also possible to dispense with the compensation for the translation errors $\Delta x$, $\Delta y$, so that a simple single-axis z-alignment (only along the optical axis of the lens), e.g., by pressing the lens into the lens holder, would then be sufficient for aligning the lens and the image sensor.

DETAILED DESCRIPTION

Figure 1A:
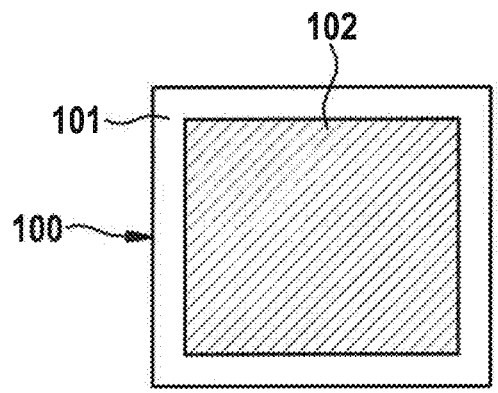
FIGS. 1a-1c illustrate an image-sensor module according to example embodiments of the present invention.
Figure 1B:
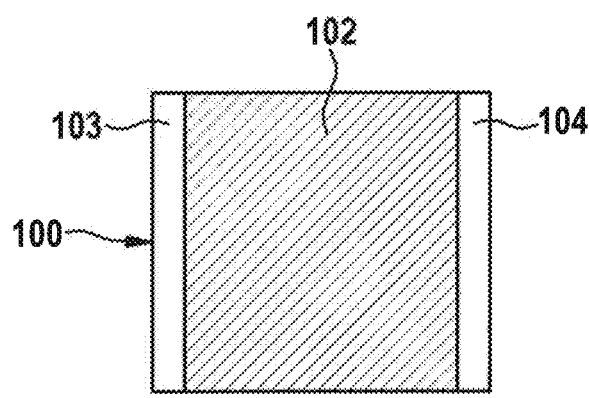
Figure 1C:
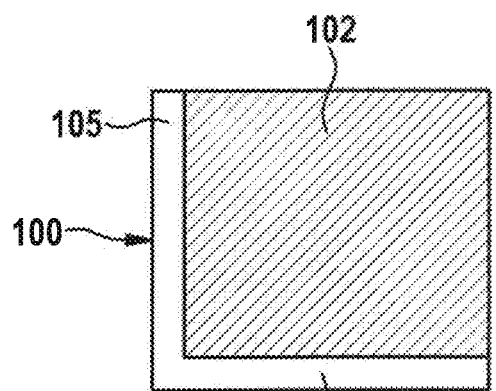

FIGS. 1a-1c shows example embodiments of an image-sensor module, which includes an image sensor 100 and a protective layer 102 that covers at least a subregion of an image-sensor surface of image sensor 100.

In FIG. 1a), the image-sensor module has a continuous region 101, which is not covered by a protective layer 102 partially covering image sensor 100 and which is made up of multiple edge regions that are not covered by protective layer 102.

In FIG. 2b), two edge regions 103, 104, which are not covered by protective layer 102, are situated on sides of the image sensor that lie opposite each other.

In FIG. 2c), two edge regions 105, 106 not covered by protective layer 102 are situated at two mutually abutting edges of the image sensor. In this exemplary embodiment, too, a continuous region of an image-sensor surface of the image sensor is not covered by protective layer 102.

Figure 2:
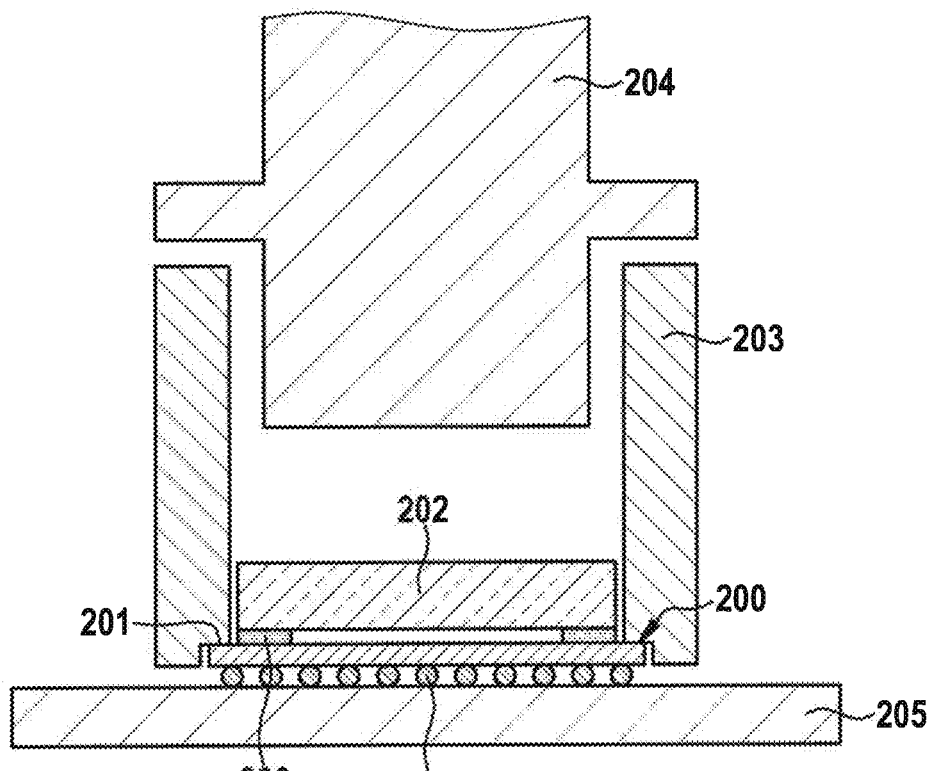
FIG. 2 illustrates camera module according to an example embodiment of the present invention.

FIG. 2 shows a possible example embodiment of the claimed camera module. It has an image-sensor module including an image sensor 200 and a protective layer applied thereon, the protective layer being developed as a glass lid 202 mounted on image sensor 200 with the aid of an adhesive joint 206. Glass lid 202 is developed in such a way that a continuous region 201 of an image-sensor surface of image sensor 200 is not covered by glass lid 202 and is therefore not protected thereby. In this exemplary embodiment, the image-sensor module is developed in a manner that corresponds to the image-sensor module from FIG. 1a). In this exemplary embodiment, image sensor 200 has a ball grid 207, which is electrically connected by way of vias with light-sensitive image-sensor elements (photodiodes) situated on the side lying opposite ball grid 207. Via this ball grid 207, image sensor 200 is soldered to a circuit board 205.

In addition, the camera module has a lens holder 203 on which a receiving region for the image-sensor module is developed. The image-sensor module is attached to lens holder 203 in such a way that image sensor 200 is resting directly against lens holder 203 by continuous region 201 of the image-sensor surface not covered by glass lid 202. Due to this mounting, a tolerance consideration for the transition between ball grid 207 and circuit board 205 becomes unnecessary since the alignment of circuit board 205 is of no importance to the positioning of image sensor 200 relative to a lens that can also be fixed in place on lens holder 203.

To fix image sensor 200 in place, the image-sensor module is radially bonded to lens holder 203 in this exemplary embodiment, so that a possible deformation of the adhesive due to temperature effects would have no influence on the positioning of image sensor 100 relative to lens holder 203. In this exemplary embodiment, the affixation of the image-sensor module on lens holder 203 is undertaken prior to mounting circuit board 205 on image sensor 200.

The direct mounting of image sensor 200 on lens holder 203 has the effect that a main axis of lens holder 203, which corresponds to the optical axis of the lens in the case of an inserted ideal lens, would be largely orthogonal with respect to the active surface of image sensor 200.

In this exemplary embodiment, the camera module also has a lens 204, which is likewise accommodated by lens holder 203. The mounting of lens 204 for this camera module was accomplished with the aid of an active alignment method in which lens 204 was aligned relative to image sensor 200. Because of the highly accurate mounting of image sensor 200 by the direct contact between image sensor 200 and lens holder 203, only an active alignment in relation to the optical axis of lens 204 in the radial direction was performed for this camera module in order to compensate for translation errors $\Delta x$, $\Delta y$, and along optical axis $\Delta z$. A correction of tilting is not required because of this type of mounting of image sensor 200 on a lens holder 203.

In this exemplary embodiment, lens 204 is connected to lens holder 203 also via a bonding connection. In this particular example, the bonding is implemented axially, but in a further exemplary embodiment it is also implemented exclusively radially in order to minimize the influence of temperature effects on the image quality. A dual-bond adhesive featuring UV prefixing was used as the adhesive in this exemplary embodiment.

Figure 6:
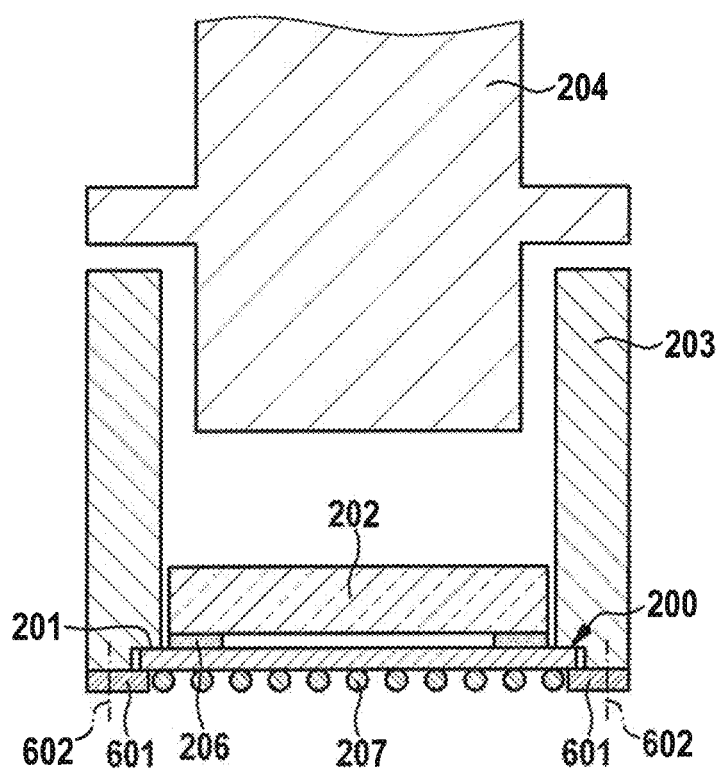
FIG. 6 illustrates a camera module according to another example embodiment of the present invention.

In another exemplary embodiment, image sensor 200 is mechanically pressed against lens holder 203. This specific embodiment is illustrated in FIG. 6. The camera module has a corresponding mechanical device 601 for this purpose by which image sensor 200 is fixed in place on lens holder 203 through force locking. In this particular exemplary embodiment, the fixing is achieved by tightening a screw connection 602 by which mechanical device 601 is mounted on lens holder 203.

In a further exemplary embodiment of the camera module, the camera module has an additional adhesive joint between circuit board 205 and lens holder 203, which serves the purpose of further securing the connection between the lens holder and the circuit board and of reducing the stressing of the solder points of ball grid 207. In this exemplary embodiment, these additional adhesive joints for mechanical stress relief have been implemented using a simple Katiobond, which cures in an exclusively thermal manner. This additional adhesive joint does not affect the fixing and aligning of image sensor 200 with respect to lens holder 203.

In a further exemplary embodiment of the camera module, the camera module has an additional adhesive joint between an inner side of lens holder 203 and glass lid 202. It, too, is used for the stable securing of the camera module.

In a further exemplary embodiment, glass lid 202 is developed in such a way that it functions as an infrared filter.

Figure 3:
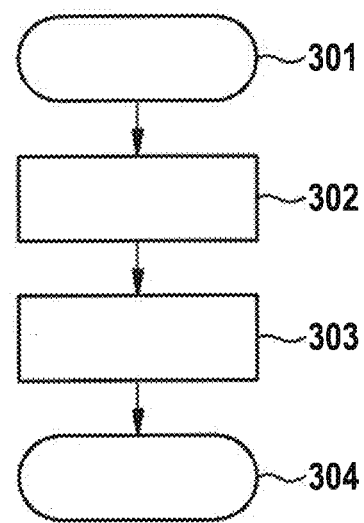
FIGS. 3-5 are flowcharts that illustrate methods according to example embodiments of the present invention.

FIG. 3 shows a schematic method for producing a camera module. The method begins in step 301. In step 302, an image sensor is positioned on a lens holder so that at least a subregion of an image-sensor surface of the image sensor comes to rest directly against the lens holder. In step 303, the image sensor is fixed in place on the lens holder. In this exemplary method, the fixing is accomplished with the aid of an adhesive. The method ends in step 304.

Figure 4:
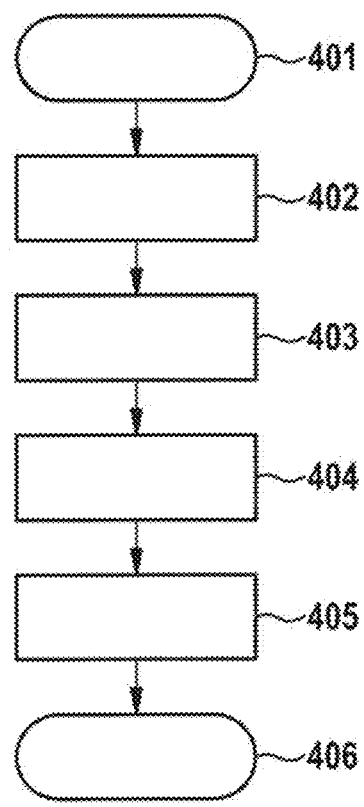

FIG. 4 shows a further exemplary embodiment of a method for producing a camera module. The method begins in step 401. In step 402, an image sensor is positioned on a lens holder so that at least a subregion of an image-sensor surface of the image sensor comes to rest directly against the lens holder. In step 403, the image sensor is fixed in place on the lens holder. In step 404, an active alignment of a lens relative to the image sensor fixed in place on the lens holder takes place. A conventional alignment method is used in this case. In step 405, the fixing of the lens on the lens holder is implemented. This is accomplished using a radial adhesive bond between an outer side of the lens and an inner side of the lens holder. The method ends in step 406.

Figure 5:
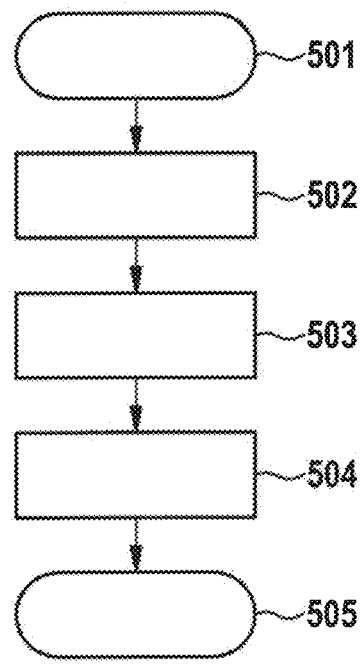

In FIG. 5, a further exemplary embodiment of a method for producing a camera module is shown. The method starts in step 501. In step 502, an image sensor is soldered to a circuit board. In step 503, the image sensor is positioned on a lens holder so that at least a subregion of an image-sensor surface of the image sensor comes to rest directly against the lens holder. In step 504, the image sensor is fixed in place on the lens holder. In this step of this exemplary embodiment, the present method differs from the afore-described method. The image sensor is fixed in place on the lens holder by fixing the circuit board in place on the lens holder. No adhesive bond is implemented between the image sensors and the lens holder. The method ends in step 505.

What is claimed is:

1. An image-sensor module comprising:
an image sensor; and
a protective layer covering a subregion of an image-sensor surface of the image sensor, wherein at least two edge regions of the image-sensor surface are not covered by the protective layer.

2. The image-sensor module of claim 1, wherein the two edge regions are at opposite edges of the image sensor.

3. The image-sensor module of claim 1, wherein the protective layer is a glass lid.

4. The image-sensor module of claim 3, wherein the glass lid is mounted on the image sensor with an adhesive.

5. The image-sensor module of claim 4, wherein the adhesive is a transparent adhesive.

6. The image-sensor module of claim 3, wherein the glass lid is an infrared filter, in particular as an IR cutoff filter.

7. The image-sensor module of claim 3, wherein the glass lid an infrared cutoff filter.

8. The image-sensor module of claim 1, wherein the protective layer is formed of a transparent casting compound.

9. The image-sensor module of claim 8, wherein the transparent casting compound is a transparent adhesive.

10. The image-sensor module of claim 1, wherein all edge regions of the image-sensor surface, which are at edges of the image sensor, are not covered by the protective layer.

11. The image-sensor module of claim 1, wherein at least one of the at least two edge regions extends along a respective edge of the image sensor and has a continuous width, which is a shortest distance between any portion of the image sensor surface that is covered by the protective layer and the edge of the image sensor, and which is at least 100 µm.

12. The image-sensor module of claim 1, wherein at least one of the at least two edge regions extends along a respective edge of the image sensor and has a continuous width, which is a shortest distance between any portion of the image sensor surface that is covered by the protective layer and the edge of the image sensor, and which is at least 300 µm.

13. The image-sensor module of claim 1, wherein at least one of the at least two edge regions extends along a respective edge of the image sensor and has a continuous width, which is a shortest distance between any portion of the image sensor surface that is covered by the protective layer and the edge of the image sensor, and which is at least 500 µm.

14. The image-sensor module of claim 1, wherein a light-sensitive side of the image sensor is electronically contacted, via at least one of vias and peripheral contactings, by a side of the image sensor that lies opposite the light-sensitive side of the image sensor.

15. An image-sensor module comprising:
an image sensor; and
a protective layer covering a subregion of an image-sensor surface of the image sensor, wherein at least two edge regions of the image-sensor surface are not covered by the protective layer,
wherein a light-sensitive side of the image sensor is electronically contacted, via at least one of vias and peripheral contactings, by a side of the image sensor that lies opposite the light-sensitive side of the image sensor, and
wherein the side that lies opposite the light-sensitive side of the image sensor has a ball grid by which the image sensor is contactable.

16. A camera module comprising:
a lens holder; and
an image sensor, wherein at least a subregion of an image-sensor surface of the image sensor rests directly against the lens holder.

17. The camera module of claim 15, further comprising:
a protective layer covering a subregion of the image-sensor surface of the image sensor, wherein:
at least two edge regions of the image-sensor surface are not covered by the protective layer; and
the lens holder includes a receptacle against which the at least two edge regions directly rest.

18. The camera module of claim 17, further comprising applying an adhesive joint between an inner side of the lens holder and the protective layer and covering a subregion of another image-sensor surface of the image sensor.

19. The camera module of claim 17, further comprising a lens mounted in the lens holder over the protective layer.

20. The camera module of claim 16, further comprising a circuit board mounted on or to the image sensor.

21. The camera module of claim 16, further comprising a lens mounted in the lens holder over the image sensor.

22. The image-sensor module of claim 1, further comprising:
   a lens holder on which the image sensor is fixed in place, with at least part of the image-sensor surface resting directly against the lens holder.

23. An image-sensor module comprising:
   an image sensor;
   a protective layer covering a subregion of an image-sensor surface of the image sensor, wherein at least two edge regions of the image-sensor surface are not covered by the protective layer; and
   a lens holder on which the image sensor is fixed in place, with at least part of the image-sensor surface resting directly against the lens holder, wherein the at least a part of the at least two edge regions form the at least the part of image-sensor surface that lies directly against the lens holder.

24. The image-sensor module of claim 23, further comprising an adhesive joint between an inner side of the lens holder and the protective layer and covering a subregion of another image-sensor surface of the image sensor.

25. The image-sensor module of claim 1, further comprising a circuit board mounted on or to the image sensor.

26. The image-sensor module of claim 1, further comprising a lens fixed over the protective layer.

* * * * *